US006944565B2

(12) United States Patent
Mcneilage et al.

(10) Patent No.: US 6,944,565 B2
(45) Date of Patent: Sep. 13, 2005

(54) SIGNAL ANALYSIS INSTRUMENT, AND A MODULE FOR A SIGNAL ANALYSIS INSTRUMENT

(75) Inventors: Cameron Mcneilage, Mt Hawthorn (AU); Mehran Mossammaparast, Como (AU); Paul Richard Stockwell, East Fremantle (AU)

(73) Assignee: Poseidon Scientific Instruments Pty Ltd, Fremantle (AU)

( * ) Notice: Subject to any disclaimer, the term of this patent is extended or adjusted under 35 U.S.C. 154(b) by 215 days.

(21) Appl. No.: 10/638,152

(22) Filed: Aug. 8, 2003

(65) Prior Publication Data

US 2005/0033526 A1 Feb. 10, 2005

(51) Int. Cl.$^7$ ................................................ H03D 3/18
(52) U.S. Cl. ........................................ 702/106; 702/191
(58) Field of Search ............................... 702/106, 107, 702/124, 126, 189–191; 375/226, 227, 269, 308, 329

(56) References Cited

U.S. PATENT DOCUMENTS

| | | | |
|---|---|---|---|
| 6,341,146 B1 * | 1/2002 | Johnson et al. | 375/329 |
| 6,411,655 B1 * | 6/2002 | Holden et al. | 375/269 |
| 6,670,861 B1 * | 12/2003 | Balboni | 332/103 |

OTHER PUBLICATIONS

Zhou et al., A Phase Controlled Self–Oscillating Mixer, 1994 IEEE MTT–S Digest, pp. 749–752, 1994.*
Ziemer et al., Principles of Communications, 2$^{nd}$ Ed., Houghton Mifflin Co., 1985, pp. 376–379.*

* cited by examiner

Primary Examiner—Patrick Assouad
Assistant Examiner—Craig Steven Miller
(74) Attorney, Agent, or Firm—Clark Hill PLC (57) ABSTRACT

A signal analysis instrument (10) and a receiver. The signal analysis instrument (10) comprises a computer (12), a phase shift mechanism, a receiver mechanism and data acquisition device. The phase shift mechanism comprises an input (100) for receiving a first high frequency signal; a phase shifter (114) arranged to act on the first high frequency signal to produce a phase-shifted first high frequency signal; and a phase shift controller (116) arranged to control operation of the phase shifter (114) in response to instructions from the computer (12). The receiver mechanism comprises a mixer (104) and a first signal conditioning circuit (106). The mixer (104) is responsive to the phase-shifted first high frequency signal and to a second high frequency signal to produce a mixer output signal. The first signal conditioning circuit (106) is responsive to the mixer output signal to produce a receiver output signal. The data acquisition device (34, 108) is responsive to the receiver output signal and the computer (12) is connected to the data acquisition device to receive data therefrom. The computer (12) is arranged to control the phase shifter (114) and to analyse data from the data acquisition device (34, 108) to determine a position of the phase shifter (114) corresponding to the mixer (104) being phase-sensitive, and to determine a conversion ratio of the receiver mechanism. A receiver per se, is also provided comprising the mixer (104) connected to first and second high frequency inputs, the phase shifter (114) provided between the second high frequency input and the mixer (104), a frequency counter circuit (110) to count the frequency of either of the input frequency signals, the receiver controller (116) and the first signal conditioning circuit (106). The receiver controller (116) is connected to the frequency counter circuit (110) to read the frequency count and communicate it to the signal analysis instrument (10).

23 Claims, 6 Drawing Sheets

PRIOR ART

Figure 1

PRIOR ART

Figure 2

PRIOR ART

SIGNAL ANALYSIS INSTRUMENT, AND A MODULE FOR A SIGNAL ANALYSIS INSTRUMENT

FIELD OF THE INVENTION

This invention relates to a signal analysis instrument and to a module therefor, and in particular to a signal analysis instrument for measuring phase noise, and to a module therefor.

Throughout the specification, unless the context requires otherwise, the word "comprise" or variations such as "comprises" or "comprising," will be understood to imply the inclusion of a stated integer or group of integers but not the exclusion of any other integer or group of integers.

Throughout the specification, unless the context requires otherwise, the phrase "high frequency" will be understood to include radio frequencies and microwave-frequencies, and is considered to include frequencies between 5 MHz and 40 GHz.

BACKGROUND ART

The following discussion of the background to the invention is intended to facilitate an understanding of the present invention. However, it should be appreciated that the discussion is not an acknowledgement or admission that any of the material referred to was published, known or part of the common general knowledge as at the priority date of the application.

One application where signal analysis instruments are used is the measurement of phase noise. There are two general types of phase noise measurement, oscillator phase noise measurement and residual phase noise measurement of a two-port device such as an amplifier.

Two common measurement techniques used to measure the phase noise of oscillators involve the measurement of a single oscillator using a delay line, or the measurement of two phase-locked oscillators.

Figure 1:
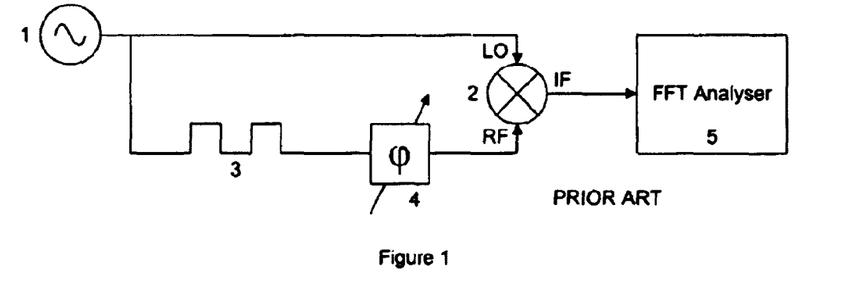
FIG. 1 shows a prior art configuration for a single oscillator phase noise measurement.

FIG. 1 shows an example configuration of a single oscillator phase noise measurement. In this configuration, an output signal from an oscillator 1 is input to an LO port of a mixer 2 and to an RF port of the mixer 2. A delay line 3 and a variable phase shifter 4 are provided between the oscillator 1 and the RF port of the mixer 2.

The delay line 3, generally a fixed length of cable or equivalent, de-correlates the signals appearing at the RF and LO ports of the mixer 2. The delay line 3 must have an electrical length that is many wavelengths at the frequency of the oscillator 1 to de-correlate the signals sufficiently for a phase noise measurement. The variable phase shifter 4 allows finer adjustment, generally less than a wavelength, of the relative phase between the signals appearing at the RF and LO ports of the mixer 2. The phase shifter 4 is necessary to ensure the signals appearing at the RF and LO ports of the mixer 2 are in quadrature to ensure the mixer 2 is phase-sensitive.

The output of the mixer 2 represents the phase noise of the oscillator 1, and is input to a signal analysis instrument 5. The signal analysis instrument 5 is used to analyse the spectral density of the output from the mixer 2.

The measurement configuration shown in FIG. 1 has practical limits, imposed by the length of the delay line 3 and signal loss through the delay line 3, on the sensitivity of the phase noise measurements that can be made. One upshot of this limit on the sensitivity of the measurement configuration is that the phase shifter 4 can be of an active design, such as a varactor phase shifter; although active phase shifters generate their own noise it does not impact on the sensitivity of the measurement configuration shown in FIG. 1.

Figure 2:
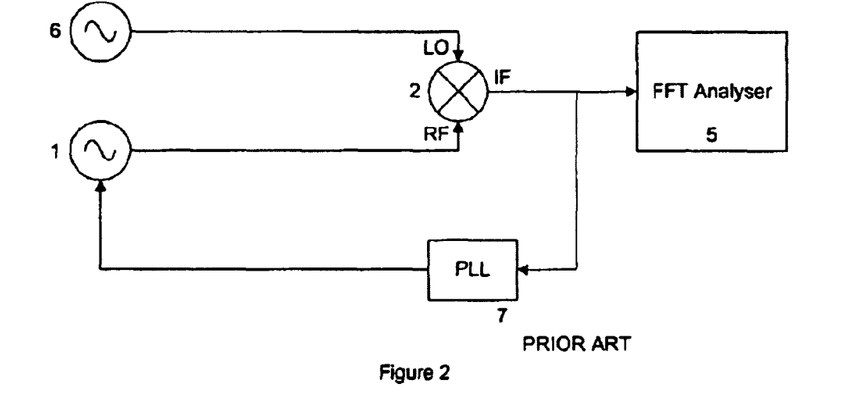
FIG. 2 shows a prior art configuration for a two-oscillator phase noise measurement.

FIG. 2 shows an example configuration of a two-oscillator phase noise measurement. Like reference numerals are used to denote like parts to those shown in FIG. 1. In this configuration, an output signal from a second oscillator 6 is input to the LO port of the mixer 2 and the output signal from the oscillator 1 is input to the RF port of the mixer 2. The output of the mixer 2 represents the sum of the phase noise of the oscillators 1 and 6, and is input to the signal analysis instrument 5. The output of the mixer 2 is also input to a phase-locked loop circuit 7, which is used to phase lock the oscillator 1 to be in quadrature with the second oscillator 6.

The measurement configuration shown in FIG. 2 does not require a delay line, and accordingly can offer superior sensitivity to the configuration in FIG. 1.

Figure 3:
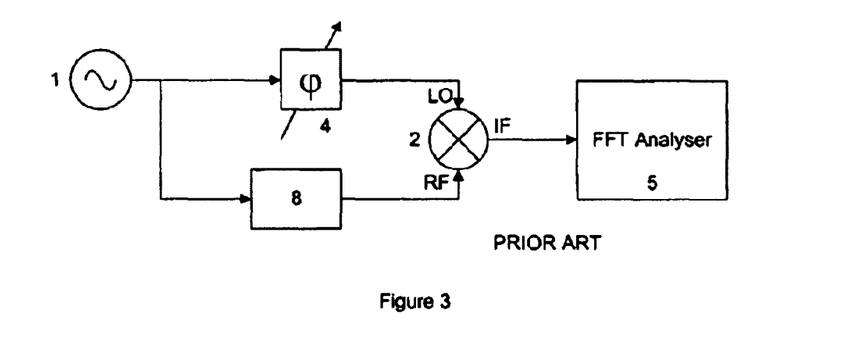
FIG. 3 shows a prior art configuration for a residual phase noise measurement.

FIG. 3 shows an example configuration of a residual phase noise measurement of a two-port device 8. Like reference numerals are used to denote like parts to those shown in FIG. 1. In this configuration, an output signal from the oscillator 1 is input to the LO port of the mixer 2 via the variable phase shifter 4 and to the device 8. An output from the device 8 passes is input to the RF port of the mixer 2.

The output of the mixer 2 represents the residual phase noise of the device 8, and is input to the signal analysis instrument 5. The measurement configuration shown in FIG. 3 can perform high sensitivity measurements, however the sensitivity can be limited by noise and insertion loss from the phase shifter 4 if varactor phase shifters are used. Accordingly, mechanical phase shifters such as trombone phase shifters are used where high sensitivity is required.

In each of the measurement configurations shown in FIGS. 1 to 3, it is necessary to measure the sensitivity with which the mixer 2 converts phase variations in the signals present at its LO and RF inputs to its output signal at its IF port. This sensitivity is commonly called conversion sensitivity or conversion ratio, and is expressed in Volts per radian. In order to produce an accurate spectral density measurement of phase noise, the instrument 6 must take into account the conversion factor when measuring the output from the mixer 2.

The conversion factor is the slope of the voltage output from the mixer 2 at the zero-volt crossing, and has units of volts per radian. A common simplification used to determine the conversion factor assumes that the output from the mixer 2 is sinusoidal. The slope of a perfect sinusoid at its zero-crossing is equal to its peak amplitude. Thus if the output of the mixer 2 is a perfect sinusoid, the conversion ratio can be determined by measuring the amplitude of the sinusoid.

The conversion factor for the single oscillator phase noise measurement configuration shown in FIG. 1 is determined by adjusting the variable phase shifter 4 while observing the change in output voltage from the mixer 2. Where varactor phase shifters are used as the variable phase shifter 4, adjusting the phase shifter is achieved by altering the bias voltage applied to the varactors.

The conversion factor for the two-oscillator phase noise measurement configuration shown in FIG. 2 is generally determined from a sinusoidal beat signal observed at the output of the mixer 2, which is obtained by disconnecting the phase-locked loop circuit 7 and adjusting the frequencies of the oscillators 1 and 6 until a suitable beat signal is obtained.

The conversion factor for the residual phase noise measurement configuration shown in FIG. 3 is determined by adjusting the phase shifter 4 while observing the change in output voltage from the mixer 2.

Some instruments calculate the conversion factor for single-oscillator or two-oscillator phase noise measurements. However determining the conversion factor for a residual noise measurement is still a manual process that is prone to error and laborious.

Phase noise, and its measurement, is described in more detail in NIST Technical Note 1337.

SUMMARY OF THE INVENTION

In accordance with a first aspect of this invention, there is provided a signal analysis instrument including a computer; a phase shift mechanism that includes an input for receiving a first high frequency signal, a phase shifter arranged to act on the first high frequency signal to produce a phase-shifted first high frequency signal, and a phase shift controller arranged to control operation of the phase shifter in response to instructions from the computer. In addition, the signal analysis instrument also includes a receiver mechanism comprising a mixer responsive to the phase-shifted first high frequency signal and to a second high frequency signal to produce a mixer output signal therefrom, a first signal conditioning circuit responsive to the mixer output signal to produce a receiver output signal, a data acquisition device responsive to the receiver output signal, the computer being connected to the data acquisition device to receive data therefrom. The computer is arranged to control the phase shifter and to analyse data from the data acquisition device to determine a position of the phase shifter corresponding to the mixer being phase-sensitive, and to determine a conversion ratio of the receiver mechanism.

Preferably, the phase shifter comprises a trombone phase shifter actuated by a stepper motor having a counter arranged to provide an indication of the number of steps taken by the stepper motor, the phase shift control mechanism arranged to count the number of steps from the counter and to communicate the number of steps to the signal analysis instrument.

Preferably, the phase shift control mechanism is arranged, in response to an instruction received from the signal analysis instrument, to control operation of the phase shifter to a position specified in the instruction corresponding to a number of steps of the stepper motor.

Preferably, the phase shifter further includes a plurality of cable lengths and switches, the switches being operable under control of the phase shift control mechanism to selectively connect the cable lengths in electrical series with the trombone phase shifter.

In one arrangement, the phase shift mechanism is provided integral to the receiver mechanism.

In an alternative arrangement, the phase shift mechanism is an external device, the phase shift control mechanism and the computer being in communication via an external communications bus.

Preferably, said receiver mechanism further includes a counter responsive to the first or second high frequency signal to provide a frequency count thereof, and a receiver controller being arranged to read the frequency count from the said counter and to communicate the frequency count to the computer.

Preferably, the receiver controller is arranged, in response to an instruction received from the signal analysis instrument via the communications bus, to read the frequency count from the frequency counter and to communicate the frequency count to the signal analysis instrument.

Preferably, the receiver mechanism further includes a power detection circuit to detect the level of microwave signal power in the second high frequency signal, the receiver controller being arranged to read the level of microwave signal power from the first power detection circuit and to communicate the level to the computer.

Preferably, the receiver controller is arranged, in response to an instruction received from the computer, to read the level of microwave signal power in the second high frequency signal from the power detection circuit, and to communicate the read level to the computer.

Preferably, the receiver mechanism further includes a low frequency input for receiving a low frequency signal, a first switch being provided before the first signal conditioning circuit operable under control of the receiver controller to connect either the mixer or the low frequency input to the first signal conditioning circuit.

Preferably, the instrument comprises at least two receiver mechanisms.

Preferably, each receiver mechanism is provided in a module housing, instrument including a bay for receiving a plurality of module housings.

Preferably, the computer is arranged, in response to a user command, to issue commands to a receiver controller to: read and communicate to the computer the frequency count of the second high frequency signal; control operation of the phase shifter to position the phase shifter to a plurality of positions in sequence, the computer arranged to store each position of the phase shifter and the measured module output signal from the data acquisition device corresponding with the phase shifter position in an array; the computer arranged to determine a conversion factor for a residual phase noise measurement performed via the module from the frequency count and the array of phase shifter positions and measured module output signals.

Preferably, said signal analysis instrument further comprises a phase locked loop circuit; each of the receiver mechanisms further comprising: a phase locked loop output for providing a phase locked loop signal to the phase locked loop circuit; a second switch provided at the phase locked loop output, the second switch operable under control of the receiver controller to connect either the mixer or the low frequency input to the phase locked loop output.

In accordance with a second aspect of this invention, there is provided a receiver for a signal analysis instrument, comprising: first and second high frequency inputs for receiving first and second high frequency signals; a mixer connected to the first and second high frequency inputs to produce a mixer output signal from the first and second high frequency signals; a phase shifter provided between the second high frequency input and the mixer; a frequency counter responsive to one of the first or second high frequency signals to provide a frequency count thereof; a receiver controller arranged to control operation of the phase shifter, the receiver controller being connected to the frequency counter to read the frequency count therefrom, and to communicate the frequency count to the signal analysis instrument; and a first signal conditioning circuit responsive to the mixer output signal to produce an output signal.

Preferably, the receiver controller is arranged, in response to an instruction received from the signal analysis instrument, to read the frequency count from the frequency counter and to communicate the frequency count to the signal analysis instrument.

Preferably, the receiver controller is arranged, in response to an instruction received from the signal analysis instrument, to control operation of the phase shifter to move the phase shifter to a position specified in the instruction.

Preferably, the phase shifter comprises a trombone phase shifter actuated by a stepper motor having counter arranged to provide an indication of the number of steps taken by the stepper motor, the receiver controller arranged to count the number of steps from the counter and to communicate the number of steps to the signal analysis instrument.

Preferably, the receiver further comprises a power detection circuit arranged to detect the level of microwave signal power present at the first high frequency input, the receiver controller being arranged to read said level of microwave signal power from the power detection circuit and to communicate the level to the instrument.

Preferably, the receiver controller is arranged, in response to an instruction received from the signal analysis instrument, to read the level of microwave signal power present at the first input from the power detection circuit, and to communicate the measured power to the signal analysis instrument.

Preferably, the receiver further comprises a low frequency input for receiving a low frequency signal, and a first switch provided before the first signal conditioning circuit, the first switch means operable under control of the receiver controller to connect either the mixer or the low frequency input to the first signal conditioning circuit.

Preferably, the receiver further comprises a phase locked loop output for providing a phase locked loop signal to the signal analysis instrument, and second switch provided at the phase locked loop output, the second switch operable under control of the receiver controller to connect either the mixer or the low frequency input to the phase locked loop output.

BRIEF DESCRIPTION OF THE DRAWINGS

One embodiment of this invention will now be described, by way of example, with reference to the accompanying drawings, in which.

DETAILED DESCRIPTION OF THE BEST MODE(S)

The embodiment relates to a signal analysis instrument arranged to receive a plurality of removable receivers, which is particularly well suited to measuring phase and amplitude noise of microwave signals. However, it should be appreciated that the invention is not limited to the particular embodiment described below. For example the receivers of the embodiment are particularly well suited to measuring phase and amplitude modulation of microwave signals. However, it should be appreciated that the receivers can perform other functions, as described below, and that the invention is applicable to other signal frequencies.

Figure 4:
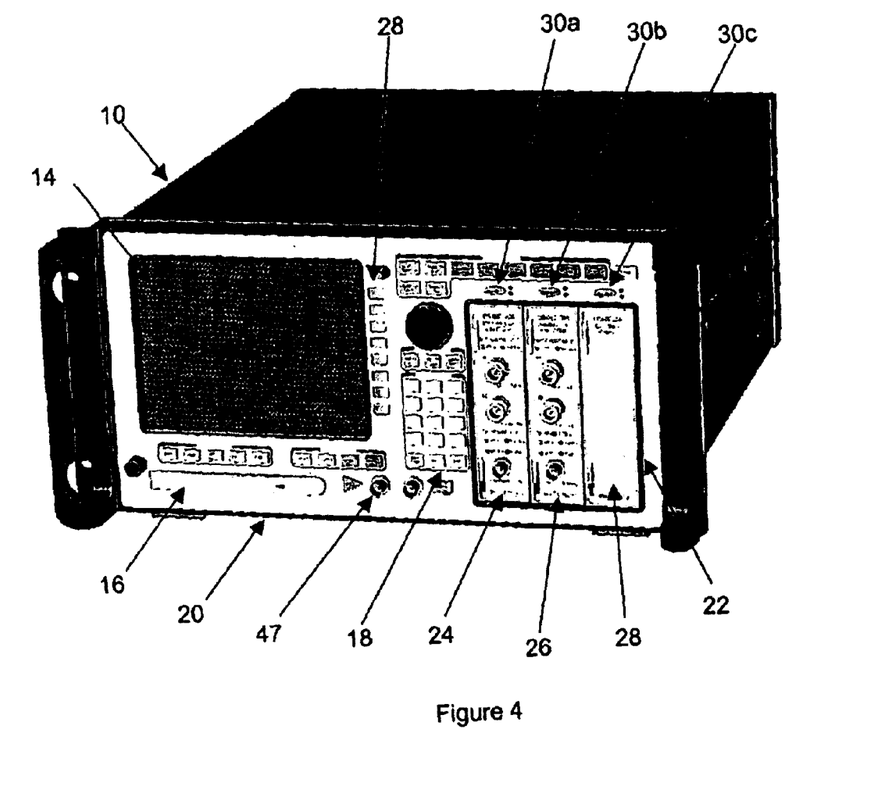
FIG. 4 shows a signal analysis instrument in accordance with the embodiment of the invention.

FIG. 4 shows a signal analysis instrument 10 according to the embodiment, comprising a computer 12 and associated display 14, storage device 16, and keys 18 provided in a case 20. The case 20 has a bay 22 formed therein for receiving three removable receivers 24, 26 and 28. In the embodiment, receivers 24 and 26 comprise microwave receivers and module 28 is an empty receiver. It should be appreciated that in other embodiments other receivers could be installed in the instrument 10.

The keys 18 are arranged in functional groups for user convenience, and provide access to menu items to control operation of the instrument 10. The keys 18 include function keys 28 that present software-controlled menu items to a user via the display 14, and three module keys 30a, 30b and 30c associated with receivers 24, 26 and 28, respectively.

Figure 5:
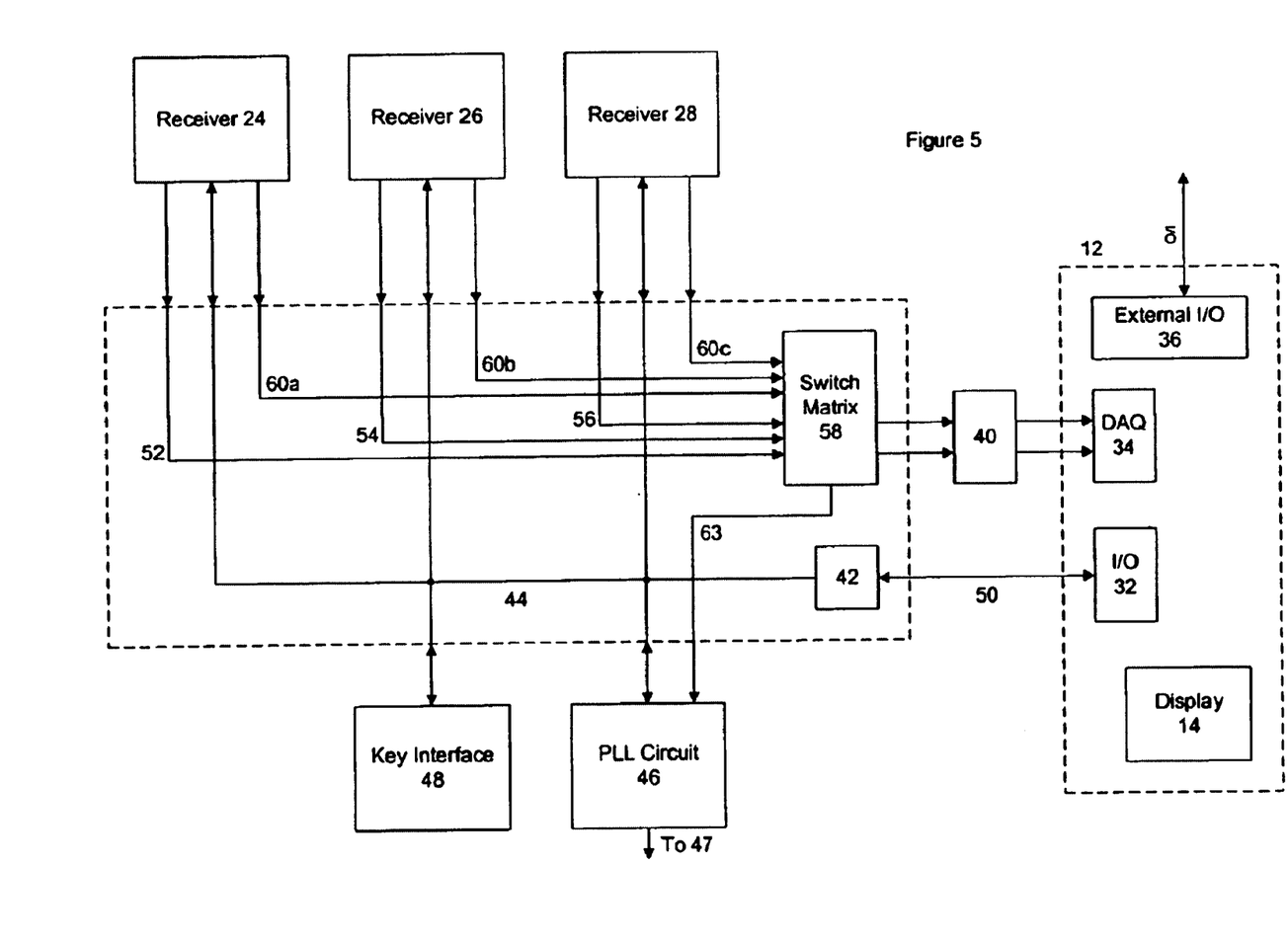
FIG. 5 is a block diagram of the signal analysis instrument shown in FIG. 4.

The computer 12 includes an internal input-output (I/O) port 32, a data acquisition card (DAQ) 34 and a plurality of external I/O ports 36, as shown in FIG. 5. The computer 32 operates under software control to acquire data from the DAQ 34, and analyse, format and display said data to the user on the display 14. In the embodiment, the software is written in the LabView programming language produced by National Instruments, however any suitable software language or development may be used.

The DAQ 34 is connected to a signal routing circuit 38 via an anti-aliasing filter 40.

The signal routing circuit 38 includes a microcontroller 42 and a command bus 44 extending from the microcontroller 42 to a phase lock loop (PLL) circuit 46 having a PLL output at 47, a key interface circuit 48. The command bus 44 also extends to each of the receivers 24, 26 and 28 via connectors (not shown) provided on signal routing circuit 38 that interface with corresponding connectors (not shown) provided at the rear of each of the receivers 24, 26 and 28.

The microcontroller 42 is also connected to a further command bus 50 extending between the microcontroller 42 and the internal I/O port 36 of the computer 12. The computer 12 can issue commands and receive responses from the PLL circuit 46, key interface 48, and receivers 24, 26 and 28 by issuing a command to the microcontroller 42 over the further command bus 50. The microcontroller 42 forwards commands to the PLL circuit 46, key interface 48, and receivers 24, 26 and 28 via the command bus 44 and receives replies therefrom. The microcontroller 42 attends to the handshaking and communication between the PLL circuit 46, key interface 48, and receivers 24, 26 and 28, and forwards replies to the computer 12 via the further command bus 50.

The signal routing circuit 38 further includes three receiver signal paths 52, 54 and 56 extending from the connectors (not shown) to a switch matrix 58, and three PLL signal paths 60a, 60b and 60c extending from the connectors (not shown) to the switch matrix 58.

The switch matrix 58 is connected to the DAQ 34 by two channel signal paths 62 via the anti-aliasing filter 40, and connected to the PLL Circuit 46 by a further PLL signal path 63.

Operation of the switch matrix 58 is controlled by the microcontroller 42 according to instructions received from the computer 12. The switch matrix 58 is configured to connect any two of the receiver signal paths 52, 54 and 56 to the channel signal paths 62, and to connect one of the PLL signal paths 60a, 60b and 60c to the further PLL signal path 63 under control of the microcontroller 42.

The anti-aliasing filter 40 includes five filters circuits (not shown) that filter signals on the channel signal paths 62 to prevent aliasing in the DAQ 34, in known manner. Selection of which filter circuit is selected is controller by the microcontroller 42 according to instructions received from the computer 12.

The receiver signal paths 52, 54 and 56 receive baseband signals from the receivers 24, 26 and 28, respectively. High frequency signal processing and control is performed in the receivers.

Figure 6:
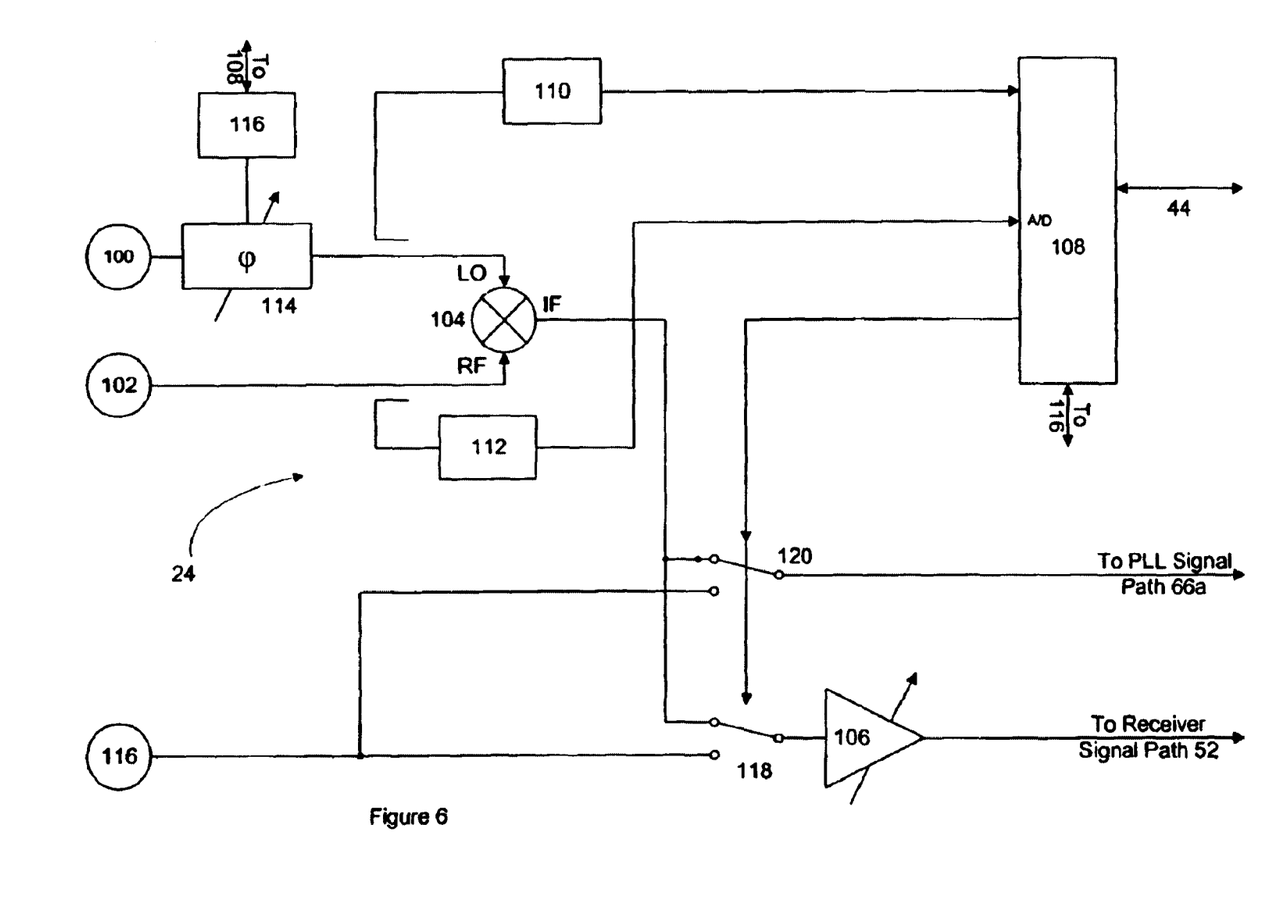
FIG. 6 is a block diagram of a receiver for the signal analysis instrument shown in FIG. 4.

FIG. 6 shows a functional diagram of the receiver 24; the receiver 26 is of like design.

The receiver 24 has a pair of high frequency input ports, an LO input port 100 and an RF input port 102. In the receiver 24 of the embodiment, the input ports 100 and 102 are capable of receiving microwave signals in the frequency range 6 to 12 GHz, however other frequency ranges are possible.

The LO input port 100 and an RF input port 102 are connected to the LO port and RF port of a mixer 104, respectively. The mixer 104 is a double-balanced mixer in the embodiment of the type that outputs a baseband signal at its IF port. The IF port of the mixer 104 is input to a signal conditioning circuit in the form of an adjustable gain stage 106, the output of which forms a receiver output signal on the receiver signal path 52 via the connector (not shown) for processing by the signal analysis instrument 10.

The receiver 24 further comprises a receiver controller in the form of a microcontroller 108, a frequency counter circuit 110, and a power detection circuit 112.

The microcontroller 108 of the receiver 24 communicates with the signal analysis instrument 10 via the microcontroller 42 and command bus 44 on the signal routing circuit 38.

The frequency counter circuit 110 counts the frequency of the signal appearing at the LO input port 100. The microcontroller 108 is connected to the output of the frequency counter circuit 110 to read data representing the frequency therefrom.

The power detection circuit 112 is arranged to detect the level of microwave signal power present at the RF input port 102. The microcontroller 108 is connected to the output of the power detection circuit 112 to read data representing the level of microwave signal power therefrom.

The receiver 24 further comprises a phase shifter, which in the embodiment is a trombone phase shifter 114, provided between the LO input 100 and the LO port of the mixer 102. The trombone phase shifter 114 is actuated by a stepper motor and associated drive circuit denoted generally at 116. The stepper motor and associated drive circuit 116 operate under control of the microprocessor 108, as described below. The stepper motor and associated drive circuit 116 includes a count indicator, which is read by the microprocessor 108 to determine the position of the phase shifter 114. The phase shifter 114 in the embodiment has at least 360 degrees of phase shift over the range of microwave frequencies that the receiver 24 is intended to be used.

The receiver 24 further comprises a baseband input 116. The baseband input 116 is connected to the variable gain stage 106. A first switch 118 is provided at the input of the variable gain stage 106 to select either the IF port of the mixer 114 or the baseband input 116 as the input to the variable gain stage 106. In this manner, the receiver output signal can either represent the output from the mixer 14, or a baseband signal received at the baseband input 116.

The IF port of the mixer 114 and the baseband input 116 are also connected to a second switch 120, the output of which forms a PLL output of the receiver 24 on the PLL signal path 60 via the connector (not shown).

Actuation of the first and second switches 118 and 120 is under control of the microcontroller 108. The first and second switches 118 and 120 allow the receiver 24 to operate with a user-supplied mixer connected to the baseband input 116 to perform phase noise measurements at other frequencies. The switches 118 and 120 are actuated from the same signal, so that the receiver output signal and the PLL output signal both correspond with either the output of the mixer 104 or the baseband input 116.

Operation of the instrument 10 will now be described with reference to performing a residual phase noise measurement of a two-port device. References in the following description to the user inputting information or issuing a command to the instrument implicitly infer use of the keys 18.

Figure 7:
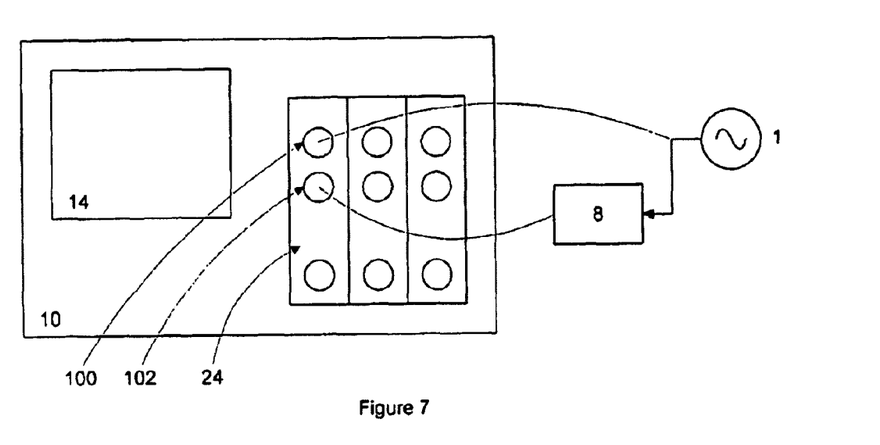
FIG. 7 shows a configuration for a residual phase noise measurement using the signal analysis instrument of FIG. 4.

To perform a residual phase noise measurement of the two-port device 8, a user firstly connects the oscillator 1 and device 8 to the instrument 10 as shown in FIG. 7.

Before a phase noise measurement can be made, the conversion ratio of the mixer 104 in the receiver 24 must be determined, and the mixer 104 must be operating in a phase-sensitive mode. In the embodiment, the instrument 10 can perform both of these requirements upon receipt of a single command from the user to measure the conversion ratio using the trombone phase shifter 114.

To measure the conversion ratio, the computer 12 firstly sends a command to the receiver 24 via the command bus 44 to measure the input power. The command is received by the microcontroller 108, which then reads data representing the level of microwave signal power at the RF input 102 from the power detection circuit 112 and communicates the read data to the computer 12. The computer 12 determines from the received data whether there is sufficient microwave power to drive the mixer 104.

Next, the computer 12 measures the change in voltage at the IF port of the mixer 104 as the position (phase length) of the phase shifter 114 is varied. The computer 12 issues a command to the receiver 24 to move the phase shifter 114 to a predetermined position. The command is received by the microcontroller 108, which actuates the stepper motor 116 while counting the number of steps taken by the stepper motor 116. When the desired position is reached, the microcontroller 108 communicates the position of the phase shifter 114 to the computer 12, referenced in terms of the number of steps turned by the stepper motor 116. The computer 12 then measures the voltage present at the DAQ 34 for the channel signal path 62 which is connected to the receiver output signal from the receiver 24.

The computer 12 then repeats the steps of issuing a command to the receiver 24 to move the phase shifter 114 to another predetermined position, and measuring the corresponding voltage present at the DAQ 34. In this way, the computer 12 builds up an array of the phase shifter 114's position vs receiver output signal as measured at the DAQ 34.

The computer 12 then analyses the array of phase shifter position vs receiver output signal to find three positions where the receiver output signal is the same, which corresponds with a complete cycle of the waveform (360 degrees). Preferably, the array is analysed for three positions where the output voltage is zero, or close to zero, however other values may be used.

Once the three positions have been determined, the number of radians of phase of the phase shifter 114 corresponding to each step of the stepper motor 116 is calculated from the total number of steps between the two furthest apart of the three positions, knowing that the number of steps corresponds with $2\pi$ radians.

An alternative manner of determining the number of degrees for each step of the stepper motor 116 is for the computer 12 to send a command to the receiver 24 via the command bus 44 to measure the frequency of the microwave signal. The command is received by the microcontroller 108, which then reads data representing the frequency of the microwave signal at the LO input 100 from the frequency counter circuit 100 and communicates the read data to the computer 12. By referencing a predetermined known length of the phase shifter and the number of steps of the stepper motor corresponding to the known length, the number of degrees for each step of the stepper motor 116 can be determined. The former method is preferred, however.

Once the number of radians of phase of the phase shifter 114 corresponding to each step of the stepper motor 116 has been calculated, the computer 12 then calculates the conversion ratio from the array. This is achieved by calculating the slope of the measured receiver output signal in the array at a zero crossing, using acquired data at that zero crossing. For a given portion of a radian change in the phase length of the phase shifter 114 (calculated from the number of steps of the stepper motor 116 and the radians per step calculated above), the change in measured receiver output signal is determined. The ratio of the change in measured receiver output signal (Volts) per change in phase length of the phase shifter 114 (radians) that produced the change in receiver output signal is the conversion ratio.

The computer 12 then issues a command to the receiver 24 to move the phase shifter 114 to the zero crossing where the conversion ration was calculated. The command is received by the microcontroller 108, which actuates the stepper motor 116 while counting the number of steps taken by the stepper motor 116. When the desired position is reached, the microcontroller 108 communicates the position of the phase shifter 114 to the computer 12, referenced in terms of the number of steps turned by the stepper motor 116.

As will be apparent to the reader, the instrument 10 automates a previously laborious task. Advantageously, however, the conversion ratio measured above is more reliable than measurements performed by many users because the instrument 10 does not rely on the assumption that the mixer output is a sinusoid—rather it calculates the slope of the mixer output at a zero-crossing.

While the foregoing description has related to residual phase noise measurement, the instrument can also be used to measure phase noise of two oscillators in a similar manner to the configuration shown in FIG. 2. Conveniently, however, the PLL and mixer are integral to instrument 10.

When measuring extremely low phase noise oscillators or devices, the noise of components in the receivers 24, such as the mixer 104, may inhibit the measurement. The instrument 10 allows cross-spectrum measurements to be performed using two similar receivers. Cross-spectrum measurement provides rejection of uncorrelated noise present in either of the two receiver's output signals. By averaging measurement results, the underlying phase noise of the oscillators or device can still be measured.

Figure 8:
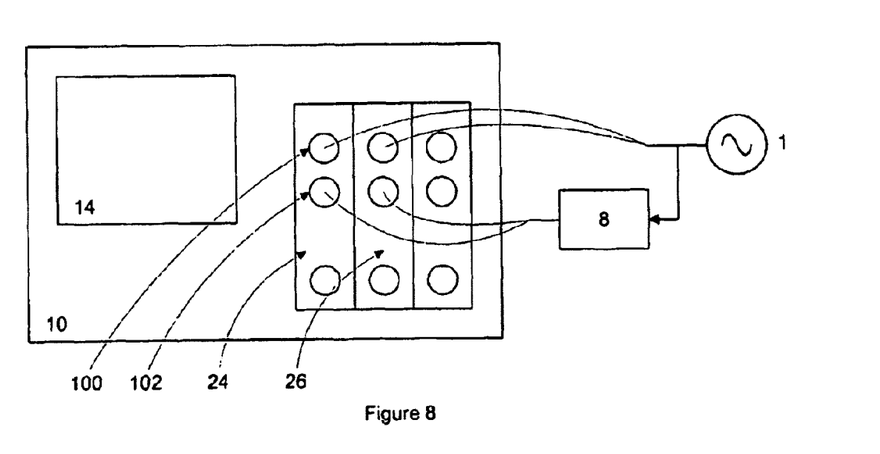
FIG. 8 shows a configuration for a cross-spectrum residual phase noise measurement using the signal analysis instrument of FIG. 4.

FIG. 8 shows the measurement configuration for a cross-spectrum residual phase noise measurement. This measurement configuration requires that the instrument calculate the conversion ratio for each receiver 24 and 26 in the same manner to that described above.

Figure 9:
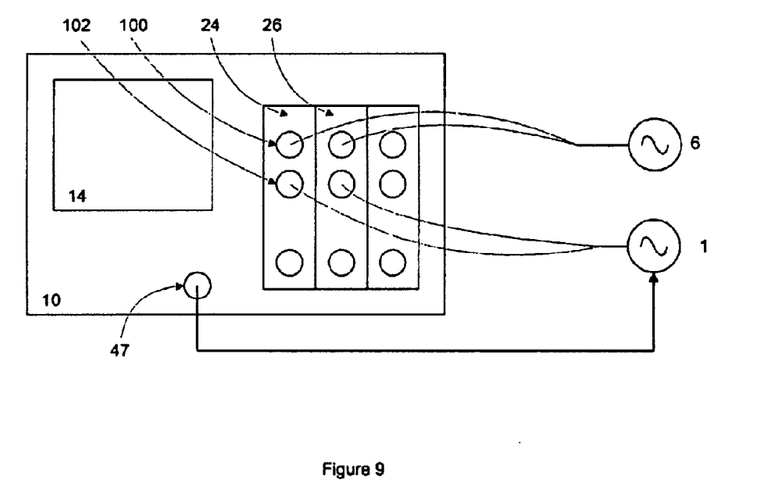
FIG. 9 shows a configuration for a cross-spectrum two-oscillator phase noise measurement using the signal analysis instrument of FIG. 4.

FIG. 9 shows the measurement configuration for a cross-spectrum phase noise measurement of two oscillators. The conversion ratio for the receiver 24 can be calculated from the beat signal produced by the oscillators prior to phase locking.

The mixer 104 in the receiver 24 is held in quadrature (phase-sensitive) by the operation of the PLL circuit 46. However, differences in cable length and variations in manufacture from one mixer to another almost always result in the mixer 104 in the receiver 26 not being in quadrature.

While the conversion ratio for the receiver 26 can also be calculated from the beat signal produced by the oscillators prior to phase locking, this would then require the phase shifter 114 be adjusted until the mixer 104 was in quadrature. A more convenient alternative available with the instrument 10 is to measure the conversion ratio for the receiver 26 after the two oscillators are phase locked, using the same command to measure the conversion ratio using the trombone phase shifter 114. This will measure the conversion ratio as described above and place the mixer 104 of the receiver 26 in quadrature, ready for cross-spectrum phase noise measurement.

It should be appreciated that the scope of this invention is not limited to the particular embodiment described above.

For example, in the embodiment the phase shifter is provided integrally with the receiver. However the wavelength at radio frequencies such as 5 MHz to 1 GHz may require the phase shifter consisting of lengths of cable in addition to a trombone phase shifter, where a switch matrix is provided to selectively switch lengths of cable in series with the trombone phase shifter to achieve sufficient a phase length of the phase shifter. Such a phase shifter may be housed in a separate case without affecting the invention—the computer 12 can communicate with an externally-housed phase shifter using the external I/O port 36.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

What is claimed is:

1. A signal analysis instrument, comprising:
   a computer;
   a phase shift mechanism comprising:
      an input for receiving a first high frequency signal;
      a phase shifter arranged to act on said first high frequency signal to produce a phase-shifted first high frequency signal;
      a phase shift controller arranged to control operation of the phase shifter in response to instructions from said computer;
   a receiver mechanism, comprising:
      a mixer responsive to the phase-shifted first high frequency signal and to a second high frequency signal to produce a mixer output signal therefrom;

a first signal conditioning circuit responsive to the mixer output signal to produce a receiver output signal;

a data acquisition mechanism responsive to the receiver output signal, the computer being connected to the data acquisition mechanism to receive data therefrom;

said computer arranged to control said phase shifter and to analyse data from said data acquisition mechanism to determine a position of said phase shifter corresponding to said mixer being phase-sensitive, and to determine a conversion ratio of said receiver mechanism.

2. A signal analysis instrument as claimed in claim 1, wherein said phase shifter comprises a trombone phase shifter actuated by a stepper motor having count means arranged to provide an indication of the number of steps taken by the stepper motor, said phase shift controller arranged to count the number of steps from said counter and to communicate the number of steps to the signal analysis instrument.

3. A signal analysis instrument as claimed in claim 2, wherein said phase shift controller is arranged, in response to an instruction received from the signal analysis instrument, to control operation of said phase shifter to a position specified in said instruction corresponding to a number of steps of the stepper motor.

4. A signal analysis instrument as claimed in claim 2, said phase shifter further comprises a plurality of cable lengths and switches, said switches being operable under control of the phase shift controller to selectively connect said cable lengths in electrical series with said trombone phase shifter.

5. A signal analysis instrument as claimed in claim 2, wherein said phase shift mechanism is provided integral to said receiver mechanism.

6. A signal analysis instrument as claimed in claim 2, wherein said phase shift mechanism is an external device, said phase shift controller and said computer being in communication via an external communications bus.

7. A signal analysis instrument as claimed in claim 1, wherein said receiver mechanism further comprises:
a counter responsive to the first or second high frequency signal to provide a frequency count thereof; and
a receiver controller being arranged to read the frequency count from said counter and to communicate said frequency count to said computer.

8. A signal analysis instrument as claimed in claim 1, wherein said receiver controller is arranged, in response to an instruction received from the signal analysis instrument via the communications bus, to read the frequency count from said frequency counter and to communicate said frequency count to the signal analysis instrument.

9. A signal analysis instrument as claimed in claim 1, wherein said receiver mechanism further comprises a power detection circuit to detect the level of microwave signal power in said second high frequency signal, said receiver controller being arranged to read said level of microwave signal power from said first power detection circuit and to communicate said level to said computer.

10. A signal analysis instrument as claimed in claim 9, wherein said receiver controller is arranged, in response to an instruction received from the computer, to read the level of microwave signal power in said second high frequency signal from the power detection circuit, and to communicate the read level to the computer.

11. A signal analysis instrument as claimed in claim 1, wherein said receiver mechanism further comprises a low frequency input for receiving a low frequency signal, a first switch being provided before the first signal conditioning circuit operable under control of the receiver controller to connect either the mixer or the low frequency input to the first signal conditioning circuit.

12. A signal analysis instrument as claimed in claim 1, said instrument comprising at least two receiver mechanism.

13. A signal analysis instrument as claimed in claim 1, wherein each receiver mechanism is provided in a module housing, said instrument including a bay for receiving a plurality of module housings.

14. A signal analysis instrument as claimed in claim 1, wherein said computer is arranged, in response to a user command, to issue instructions to a receiver controller to:
read and communicate to the computer the frequency count of the second high frequency signal;
control operation of said phase shifter to position said phase shifter to a plurality of positions in sequence, said computer arranged to store each position of the phase shifter and the measured module output signal from the data acquisition mechanism corresponding with said phase shifter position in an array;
said computer arranged to determine a conversion factor for a residual phase noise measurement performed via said module from the frequency count and the array of phase shifter positions and measured module output signals.

15. A signal analysis instrument as claimed in claim 1, further comprising:
a phase locked loop circuit;
each receiver mechanism further comprising:
a phase locked loop output for providing a phase locked loop signal to the phase locked loop circuit;
a second switch provided at the phase locked loop output, the second switch operable under control of the receiver controller to connect either the mixer or the low frequency input to the phase locked loop output.

16. A receiver for a signal analysis instrument, comprising:
first and second high frequency inputs for receiving first and second high frequency signals;
a mixer connected to the first and second high frequency inputs to produce a mixer output signal from the first and second high frequency signals;
a phase shifter provided between the second high frequency input and the mixer;
frequency counter responsive to one of the first or second high frequency signals to provide a frequency count thereof;
receiver controller arranged to control operation of the phase shifter, said receiver controller being connected to said frequency counter to read the frequency count therefrom, and to communicate the frequency count to the signal analysis instrument; and
a first signal conditioning circuit responsive to the mixer output signal to produce an output signal.

17. A receiver as claimed in claim 16, wherein said receiver controller is arranged, in response to an instruction received from the signal analysis instrument, to read the frequency count from said frequency counter and to communicate said frequency count to the signal analysis instrument.

18. A receiver as claimed in claim 16, wherein said receiver controller is arranged, in response to an instruction received from the signal analysis instrument, to control operation of said phase shifter to move said phase shifter to a position specified in said instruction.

19. A receiver as claimed in claim 18, wherein said phase shifter comprises a trombone phase shifter actuated by a stepper motor having count means arranged to provide an indication of the number of steps taken by the stepper motor, said receiver controller arranged to count the number of steps from the count means and to communicate the number of steps to the signal analysis instrument.

20. A receiver as claimed in claim 16, further comprising a power detection circuit arranged to detect the level of microwave signal power present at the first high frequency input, said receiver controller being arranged to read said level of microwave signal power from said power detection circuit and to communicate said level to said instrument.

21. A receiver as claimed in claim 16, wherein said receiver controller is arranged, in response to an instruction received from the signal analysis instrument, to read the level of microwave signal power present at the first input from the power detection circuit, and to communicate the measured power to the signal analysis instrument.

22. A receiver as claimed in claim 16, wherein the receiver further comprises a low frequency input for receiving a low frequency signal, and a first switch provided before the first signal conditioning circuit, the first switch means operable under control of the receiver controller to connect either the mixer or the low frequency input to the first signal conditioning circuit.

23. A receiver as claimed in claim 16, further comprising a phase locked loop output for providing a phase locked loop signal to the signal analysis instrument, and second switch provided at the phase locked loop output, the second switch operable under control of the receiver controller to connect either the mixer or the low frequency input to the phase locked loop output.

* * * * *